United States Patent
Kuroki

(10) Patent No.: US 7,042,973 B2
(45) Date of Patent: May 9, 2006

(54) VARIABLE DIVIDING CIRCUIT

(75) Inventor: Ryuta Kuroki, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 76 days.

(21) Appl. No.: 10/809,829

(22) Filed: Mar. 26, 2004

(65) Prior Publication Data

US 2005/0110532 A1    May 26, 2005

(30) Foreign Application Priority Data

Nov. 26, 2003    (JP)    ............... 2003-395684

(51) Int. Cl.
*H03K 21/00*    (2006.01)

(52) U.S. Cl. ............... 377/47; 377/54; 377/76

(58) Field of Classification Search ............... None
See application file for complete search history.

(56) References Cited

U.S. PATENT DOCUMENTS

| | | | | |
|---|---|---|---|---|
| 4,630,295 A | * | 12/1986 | Kamuro et al. | 377/81 |
| 5,164,970 A | * | 11/1992 | Shin et al. | 377/54 |
| 5,619,109 A | * | 4/1997 | Cameron et al. | 318/375 |
| 5,937,024 A | * | 8/1999 | Nozaki | 377/47 |
| 6,144,374 A | * | 11/2000 | Hyun | 345/204 |
| 6,275,550 B1 | * | 8/2001 | Fukuda | 375/357 |
| 6,459,751 B1 | * | 10/2002 | Chen et al. | 377/26 |
| 6,809,567 B1 | * | 10/2004 | Kim et al. | 327/160 |

FOREIGN PATENT DOCUMENTS

JP    06-091425    11/1994

* cited by examiner

*Primary Examiner*—Kenneth B. Wells
*Assistant Examiner*—Cassandra Cox
(74) *Attorney, Agent, or Firm*—Nixon Peabody LLP; Donald R. Studebaker

(57) ABSTRACT

To provide a variable dividing circuit having a high operational speed. The variable dividing circuit includes a shift register configured by cascade connection of D-type flip-flops (D11, D12, . . . , D1n) with an initializing means by clock synchronization; and a multiplexer 12 for selecting any one of output signals at respective stages of the shift register; wherein the variable dividing circuit initializes each stage of the D-type flip-flops. In this case, in an input terminal 10 of the flip-flop at the first stage, a signal at an H level or at an L level is inputted in accordance with an initializing means.

5 Claims, 3 Drawing Sheets

VARIABLE DIVIDING CIRCUIT

BACKGROUND OF THE INVENTION

1. Field of the Invention

The present invention relates to a variable dividing circuit capable of varying the number of dividing in a semiconductor integrated circuit, and particularly, the present invention relates to a variable dividing circuit effective for a circuit having many divided stages and requiring the high-speed operation.

2. Description of the Related Art

A conventional variable dividing circuit is configured by a down counter with a data loading function, and a desired number of dividing is realized by loading a predetermined value when the all data of each bit of the counter becomes logical "0" (a "L" level). For example, a variable dividing circuit using a counter is disclosed in JP-A-6-91425.

The above-described conventional variable dividing circuit involves a problem such that the operational speed thereof is low because a flip-flop configuring a counter in the conventional variable dividing circuit has a data loading function. For example, the highest operational speed of a flip-flop without a data loading function (for example, a D-type flip-flop with a resetting function) is 1.667 GHz, on the contrary, the highest operational speed of the flip-flop with the data loading function is 1.25 GHz.

SUMMARY OF THE INVENTION

A variable dividing circuit according to the present invention may comprise a shift register configured by cascade connection of D-type flip-flops with an initializing means by clock synchronization; and a selecting means for selecting any one of output signals at respective stages of the shift register; wherein the variable dividing circuit initializes each stage of the D-type flip-flops. In this case, in the flip-flop at a first stage, a signal at an H level or at an L level is inputted in accordance with an initializing means.

DESCRIPTION OF THE PREFERRED EMBODIMENTS

Figure 1:
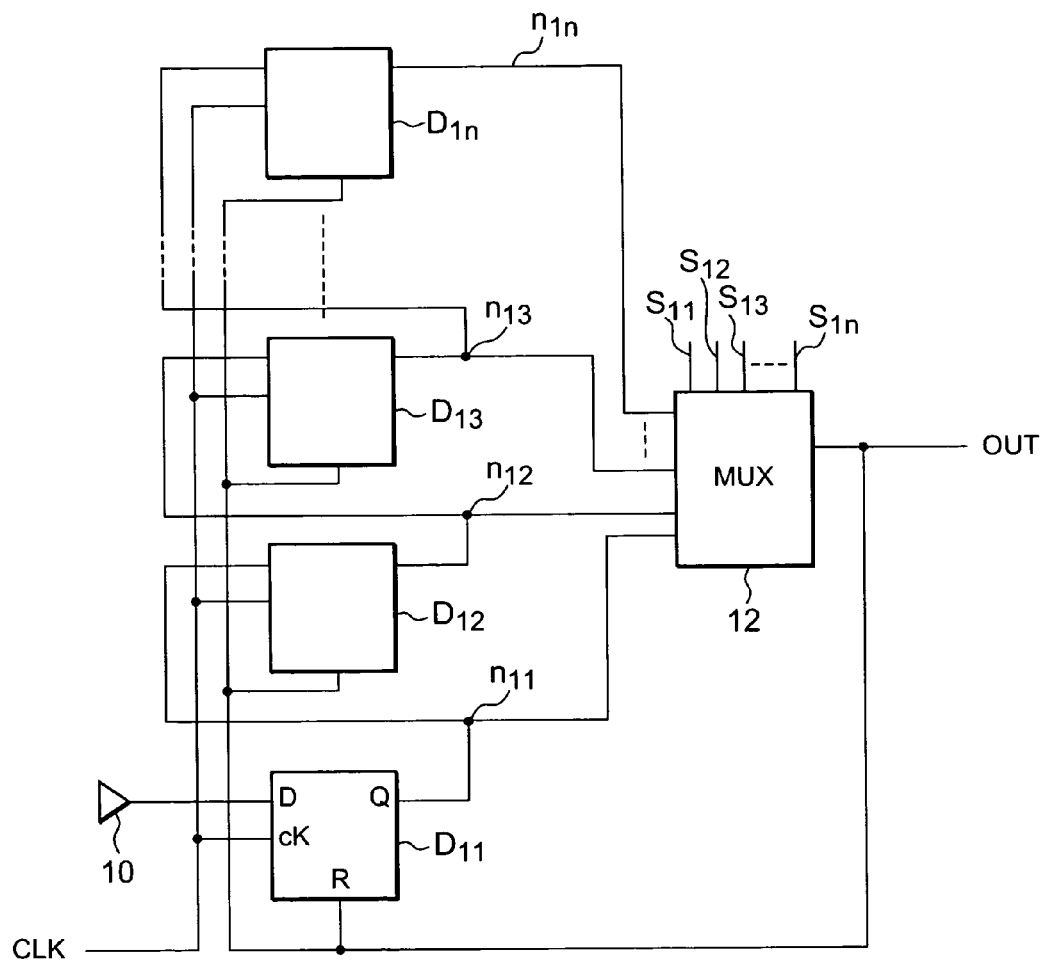
FIG. 1 is a circuit diagram a variable dividing circuit according to a first embodiment.

In a variable dividing circuit according to the present invention, each stage of a shift register is configured by a high-speed D-type flip-flop, and selecting one output, the flip-flop is reset or preset by the selected signal, so that it is preferable that a high-speed element is used for a selector and a switch as a selecting means.

The embodiments of the present invention will be described below with reference to the drawings. Each drawing schematically illustrates the present invention to a degree that the present invention can be appreciated, and the present invention is not limited only to the examples shown in the drawings. In addition, to the components having common elements and the same functions through the drawings, the same reference numerals are given, and duplicate explanation is omitted.

First Embodiment

FIG. 1 is a circuit diagram of a variable dividing circuit according to a first embodiment, and a shift register circuit is configured in such a manner that plural stages of D-type flip-flops with a synchronization reset function (D11, D12, ..., D1n) are arranged, a fixed input signal 10 at a H level (or at a L level) is inputted in an input of a flip-flop D11 at a first stage, and hereinafter, the output of the flip-flop at the former step is made the input of the flip-flop at the next stage. In addition, the output of the flip-flop at each stage is connected to each input terminal of a multiplexer (MUX) 12. Then, by making any one signal of input signals S11, S12, ..., S1n connected to an input terminal of a selected signal effective, one signal is selected and outputted (a signal OUT). This signal is feed-backed to a reset terminal of each flip-flop and is synchronized with a clock signal (CLK) so as to reset each flip-flop.

By the way, according to the above-described example, it is described that the shift register is configured by the D-type flip-flops with the reset function, however, it is possible to configure the shift register by using the D-type flip-flops with a synchronization preset function, a L level is inputted in the input signal at the first stage, and its OUT signal is feed-backed to a preset input terminal of the flip-flop at each stage (see a later-described timing chart (FIG. 4)).

The operation of the variable dividing circuit in the case that the shift register is configured by the D-type flip-flops with the reset function will be described in detail below.

Figure 3:
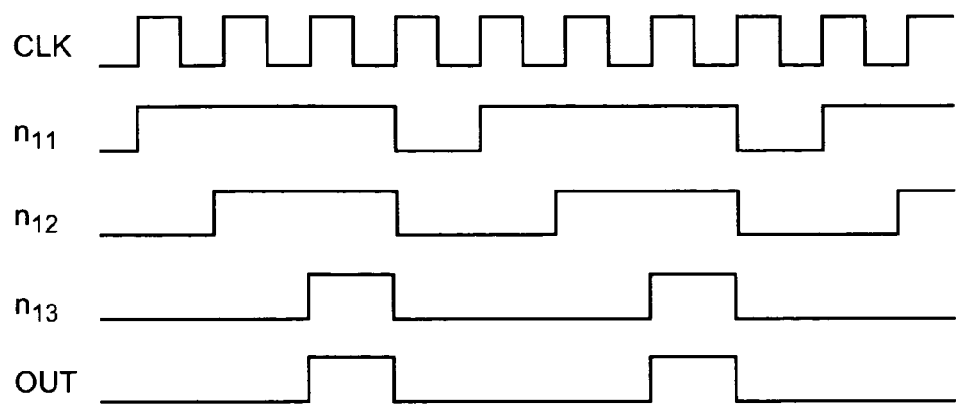
FIG. 3 is an example of a timing chart of the circuit according to the first embodiment.

As shown in FIG. 3, when the input data of the first stage of the shift register is set at a H level, an output n11 of the flip-flop at the first stage becomes the H level at a leading edge of a first clock signal, at the leading edge of the next clock, an output n12 of the flip-flop at the second stage is changed into the H level, and at the leading edge of the third clock, an output n13 of the flip-flop at the third stage is changed into the H level. In this case, if the selected signal of the multiplexer (MUX) as the selecting means of the output signal of the flip-flop at each stage is set at S13, at a time when the output signal n13 of the flip-flop at the third stage is changed into the H level, the signal of a node n13 is outputted to an output OUT. Since this signal is connected to a synchronization reset terminal of each flip-flop, at the leading edge of the next clock, the output of the flip-flop at each stage is initialized from the H level into the L level.

Further, if the next clock signal is inputted, at the leading edge thereof, the output n11 of the flip-flop at the first stage is made the H level, and hereinafter, the same operation is repeated. Thereby, in this case, a clock of a fourfold period of an original clock (CLK) signal is outputted, and the original clock is divided into four.

As being obvious from the above description, in the variable dividing circuit according to the present embodiment, by arbitrarily setting the selected signal of the multiplexer as the selecting means of the output signal of each flip-flop (setting one signal among a plurality of selected signals effective), it is possible to configure the variable dividing circuit.

Figure 4:
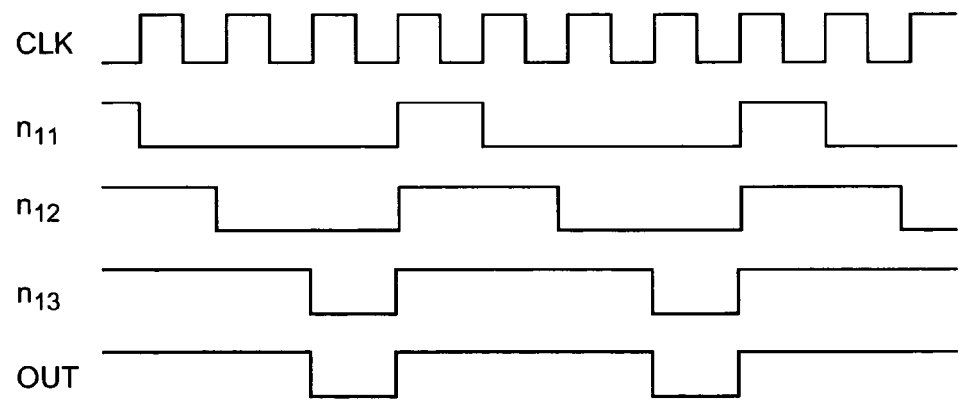
FIG. 4 is an example of a timing chart of the circuit according to the first embodiment.

By the way, if the L level is inputted in the flip-flop at the first stage of the shift register, by configuring the shift register using the flip-flop as the D-type flip-flop with the synchronization preset function, it is possible to configure the variable dividing circuit which performs the operation as shown in the timing chart in FIG. 4.

Second Embodiment

Figure 2:
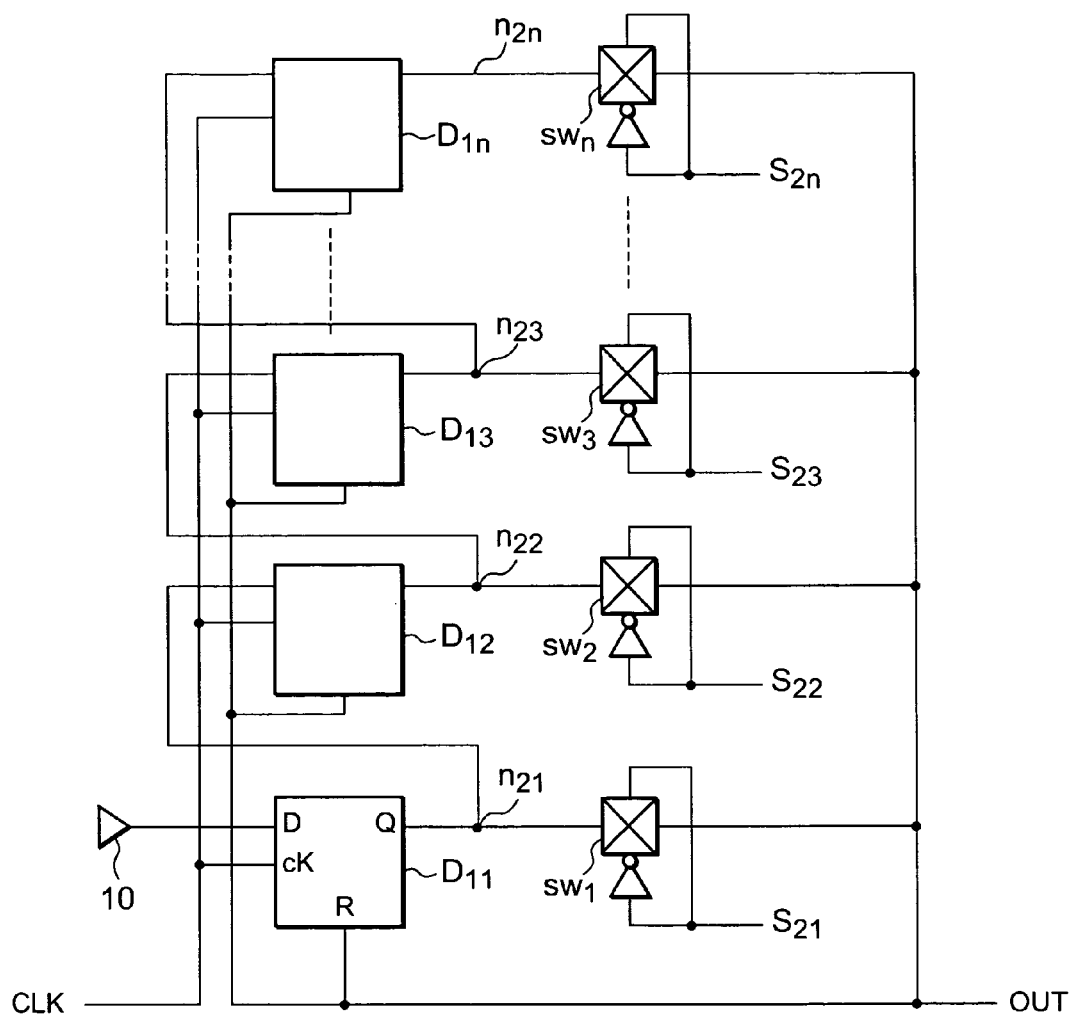
FIG. 2 is a circuit diagram a variable dividing circuit according to a second embodiment.

FIG. 2 is a circuit diagram a variable dividing circuit according to a second embodiment, and a shift register is configured in such a manner that plural stages of D-type flip-flops with a synchronization reset function (D11, D12, . . . , D1n) are arranged, a fixed input signal 10 at a H level (or at a L level) is inputted in an input of a flip-flop D11 at a first stage, and hereinafter, the output of the flip-flop at the former step is made the input of the flip-flop at the next stage. In addition, the output of the flip-flop at each stage is connected to each input terminal of switches (SW1, SW2, . . . , SWn). Then, by making any one signal of control signals SW1, SW2, . . . , SWn connected to the control signal of each switch effective, a signal connected to one switch is selected and outputted (a signal OUT). This signal is feed-backed to a reset terminal of each flip-flop and is synchronized with a clock signal (CLK) so as to reset each flip-flop.

By the way, according to the above-described example, it is described that the shift register is configured by the D-type flip-flops with the reset function, however, as same as the first embodiment, it is possible to configure the shift register by using the D-type flip-flops with a synchronization preset function, a L level is inputted in the input signal at the first stage, and the OUT signal is feed-backed to a preset input terminal of the flip-flop at each stage.

In the present embodiment, the multiplexer in the first embodiment is replaced with the switch, and the other configurations are identical with the first embodiment, so that the detailed explanation of the operation of the variable dividing circuit according to the present embodiment is herein omitted.

What is claimed is:

1. A variable dividing circuit comprising:
   a shift register configured by a cascade connection of D-type flip-flops, wherein the D-type flip-flops respectively generate output signals; and
   a selecting circuit which selects any one of the output signals as an output signal of the variable dividing circuit;
   wherein the D-type flip=flops are respectively reset by the selected one of the output signals.

2. The variable dividing circuit according to claim 1, wherein an H level signal is inputted in a first stage of said D-type flip flop; and
   said selecting circuit comprises a multiplexer.

3. The variable dividing circuit according to claim 1, wherein an H level signal is inputted in a first stage of said D-type flip-flop; and
   said selecting circuit comprises a switch circuit.

4. The variable dividing circuit according to claim 1, wherein an L level signal is inputted in a first stage of said D-type flip flop; and
   said selecting circuit comprises a multiplexer.

5. The variable dividing circuit according to claim 1, wherein an L level signal is inputted in a first stage of said D-type flip-flop; and
   said selecting circuit comprises a switch circuit.

* * * * *